United States Patent
Katayama et al.

(10) Patent No.: US 6,951,604 B2
(45) Date of Patent: Oct. 4, 2005

(54) PRODUCTION METHOD FOR FLEXIBLE PRINTED BOARD

(75) Inventors: Naoki Katayama, Kasugai (JP); Yasuhiro Hayashi, Kasugai (JP); Joonhaneng Kang, Nagoya (JP)

(73) Assignees: Tokai Rubber Industries, Ltd., Komaki (JP); Okuno Chemical Industries Co., Ltd., Osaka (JP)

( * ) Notice: Subject to any disclaimer, the term of this patent is extended or adjusted under 35 U.S.C. 154(b) by 103 days.

(21) Appl. No.: 10/638,542

(22) Filed: Aug. 12, 2003

(65) Prior Publication Data

US 2004/0069649 A1 Apr. 15, 2004

(30) Foreign Application Priority Data

| | | |
|---|---|---|
| Aug. 13, 2002 | (JP) | 2002-235585 |
| Oct. 7, 2002 | (JP) | 2002-293377 |
| Apr. 25, 2003 | (JP) | 2003-122148 |

(51) Int. Cl.$^7$ .......................... C25D 5/56; C25D 5/02; C25D 5/34; C23C 28/02
(52) U.S. Cl. .................... 205/169; 205/125; 205/187; 205/210
(58) Field of Search ................... 205/125, 169, 205/187, 210

(56) References Cited

U.S. PATENT DOCUMENTS

| | | | | |
|---|---|---|---|---|
| 4,112,139 | A | * 9/1978 | Shirk et al. | 430/315 |
| 4,725,504 | A | * 2/1988 | Knudsen et al. | 428/458 |
| 4,868,071 | A | 9/1989 | Walsh et al. | 428/626 |
| 4,894,124 | A | 1/1990 | Walsh et al. | 204/30 |
| 5,246,564 | A | 9/1993 | Tamiya et al. | 205/169 |
| 6,495,769 | B1 | 12/2002 | Saito et al. | 174/255 |
| 2004/0170846 | A1 | * 9/2004 | Seita et al. | 428/457 |

* cited by examiner

Primary Examiner—Edna Wong
(74) Attorney, Agent, or Firm—Armstrong, Kratz, Quintos, Hanson & Brooks, LLP

(57) ABSTRACT

A flexible printed board production method which ensures higher adhesion of copper, excellent workability, easier continuous production and lower costs. The flexible printed board production method comprises the steps of: treating a surface of a polyimide resin film with plasma or short wavelength ultraviolet radiation; activating the treated surface with the use of an alkali metal hydroxide; electrolessly plating the surface of the polyimide resin film with nickel; and electroplating the electrolessly plated surface of the polyimide resin film with copper, whereby a copper layer is formed on the surface of the polyimide resin film.

18 Claims, 3 Drawing Sheets

PRODUCTION METHOD FOR FLEXIBLE PRINTED BOARD

BACKGROUND OF THE INVENTION

1. Field of the Invention

The present invention relates to a production method for a flexible printed board.

2. Description of the Art

Conventional flexible printed boards generally have a three-ply laminate structure such that a copper foil is stacked on a polyimide resin film with the intervention of an adhesive layer. With recent advancement of the electronic industry, the flexible printed boards are increasingly demanded to have a high temperature resistance. However, the adhesive layer of such a flexible printed board of three-ply laminate structure is poor in heat resistance. To cope with this, there is proposed a flexible printed board having a two-ply laminate structure such that a copper foil is directly stacked on a polyimide resin film.

Exemplary production methods (1) to (3) for the flexible printed board of two-ply laminate structure will be described below.

(1) A polyimide varnish is applied onto a surface of a copper foil, and then heated.

(2) After a surface of a polyimide resin film is plasma-treated in a vacuum vessel, nickel or chromium is sputtered on the surface of the polyimide resin film for formation of a foundation, and copper is sputtered on the foundation. After the resulting polyimide resin film is taken out of the vacuum vessel, the polyimide resin film is electroplated with copper.

(3) A surface of a polyimide resin film is etched with an aqueous solution of a mixture of hydrazine and an alkali metal hydroxide, and then electrolessly plated with nickel or cobalt. In turn, the resulting polyimide resin film is heat-treated at a high temperature on the order of 400° C., and then electro-plated with copper (Japanese Unexamined Patent Publication No. 5-114779 (1993)).

In the case of the method (1), however, it is impossible, from the viewpoint of the workability, to employ a copper foil having a thickness of not greater than 12 μm. In the case of the method (2), the surface modification of the polyimide resin film by the plasma treatment alone is not sufficient to change the surface configuration of the polyimide resin film. Therefore, a physical anchoring effect cannot be expected, so that the adhesion of the copper film is weak. In addition, the use of the vacuum vessel leads to higher equipment costs and difficulty in continuous production, resulting in higher costs. In the case of the method (3), the use of highly deleterious hydrazine deteriorates the workability. In addition, a high temperature heat treatment should be performed between the electroless plating step and the electroplating step for imidizing a part of polyimide affected by intensive etching. This makes the continuous production difficult.

In view of the foregoing, it is an object of the present invention to provide a production method for a flexible printed board, which ensures higher adhesion of copper, better workability, easier continuous production and lower costs.

SUMMARY OF THE INVENTION

According to the present invention to achieve the aforesaid object, a production method for a flexible printed board comprises the steps of: treating a surface of a polyimide resin film with plasma or short wavelength ultraviolet radiation; activating the treated surface with the use of an alkali metal hydroxide; electrolessly plating the surface of the polyimide resin film with nickel or a nickel alloy; and electroplating the electrolessly plated surface of the polyimide resin film with copper, whereby a copper layer is formed on the surface of the polyimide resin film.

The inventors of the present invention have conducted intensive studies to ensure higher adhesion of copper, better workability, easier continuous production and lower costs in a production method for a flexible printed board including a polyimide resin film and a copper layer formed on a surface of the polyimide resin film by plating. As a result, the inventors have found that only the outermost surface portion of the polyimide film is roughened and imide rings are opened to provide functional groups by treating the surface of the polyimide resin film with plasma or short wavelength ultraviolet radiation and then lightly activating the treated surface with an alkali metal hydroxide (i.e., at a lower alkaline concentration at a lower treatment temperature for a shorter treatment period). This is because the outermost surface portion of the polyimide resin film is imparted with a hydrophilic property by the plasma treatment or the short wavelength ultraviolet radiation treatment thereby to be efficiently and uniformly activated with the use of the alkali metal hydroxide. Thus, the adhesion of a nickel layer or the like to be formed by electroless plating and, hence, the adhesion of a copper layer to be formed on the nickel layer or the like by plating can be enhanced physically (by the anchoring effect provided by the roughening) and chemically (by bonds to the functional groups). Further, the light activation with the use of the alkali metal hydroxide is less likely to affect the polyimide resin film which is less resistant to alkali. The flexible printed board production method is excellent in workability without the use of a deleterious substance. Further, the production method does not require a high temperature heat treatment to be performed between the respective process steps and, hence, facilitates continuous production. As a result, the costs can be reduced. Thus, the inventors have attained the present invention.

DESCRIPTION OF THE PREFERRED EMBODIMENTS

The present invention will hereinafter be described in detail with reference to the attached drawings.

In a flexible printed board production method according to one embodiment of the present invention, a surface of a polyimide resin film is first plasma-treated. Then, the surface of the polyimide resin film is activated with the use of an alkali metal hydroxide. After a metal catalyst is applied onto the surface of the polyimide resin film, a reduction treatment is performed on the surface of the polyimide resin film with the use of a reducing agent. Subsequently, the surface of the polyimide resin film is electrolessly plated with nickel.

Figure 1:
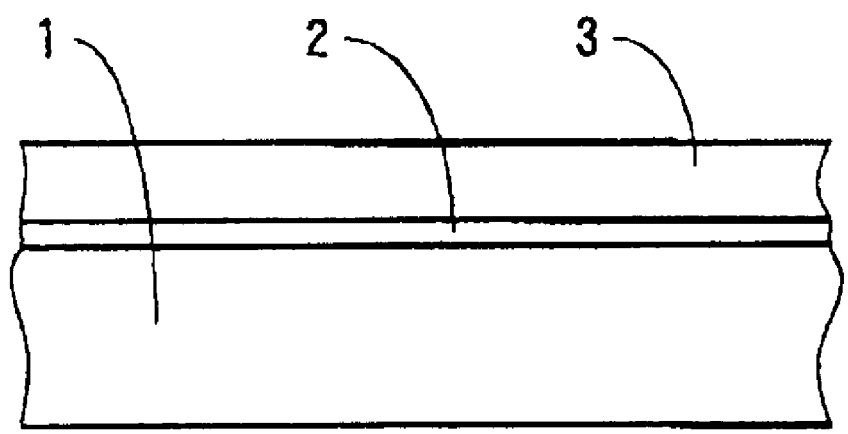
FIG. 1 is a side view schematically illustrating a flexible printed board to be produced by a flexible printed board production method according to one embodiment of the present invention.

Then, the surface of the resulting nickel layer is dried as required, and plated with copper. Thus, a flexible printed board is produced, which includes a polyimide resin film 1, a nickel layer 2 formed on the surface of the polyimide resin film by the plating, and a copper layer 3 formed on the surface of the nickel layer 2 by the plating as shown in FIG. 1.

More specifically, the plasma treatment is not particularly limited, but may be a reduced pressure plasma treatment performed in a vacuum vessel at a reduced pressure or a normal pressure plasma treatment performed at or around an atmospheric pressure. Where the normal pressure plasma treatment is performed, a gas to be used is not particularly limited, but examples thereof include air, argon and nitrogen, which are typically employed in the art. The plasma treatment generates hydrophilic functional groups such as hydroxyl groups, carboxyl groups and carbonyl groups on the surface of the polyimide resin film.

The alkali metal hydroxide to be employed for the activation is not particularly limited, but examples thereof include sodium hydroxide and potassium hydroxide. Since the surface of the polyimide resin film to be activated is already imparted with a hydrophilic property by the plasma treatment, the activation may lightly be carried out, i.e., at a low alkali metal hydroxide concentration in the range of 0.5 to 2 mol/l at a low treatment temperature on the order of 25° C. for a short treatment period in the range of 0.5 to 2 minutes.

Figure 2:
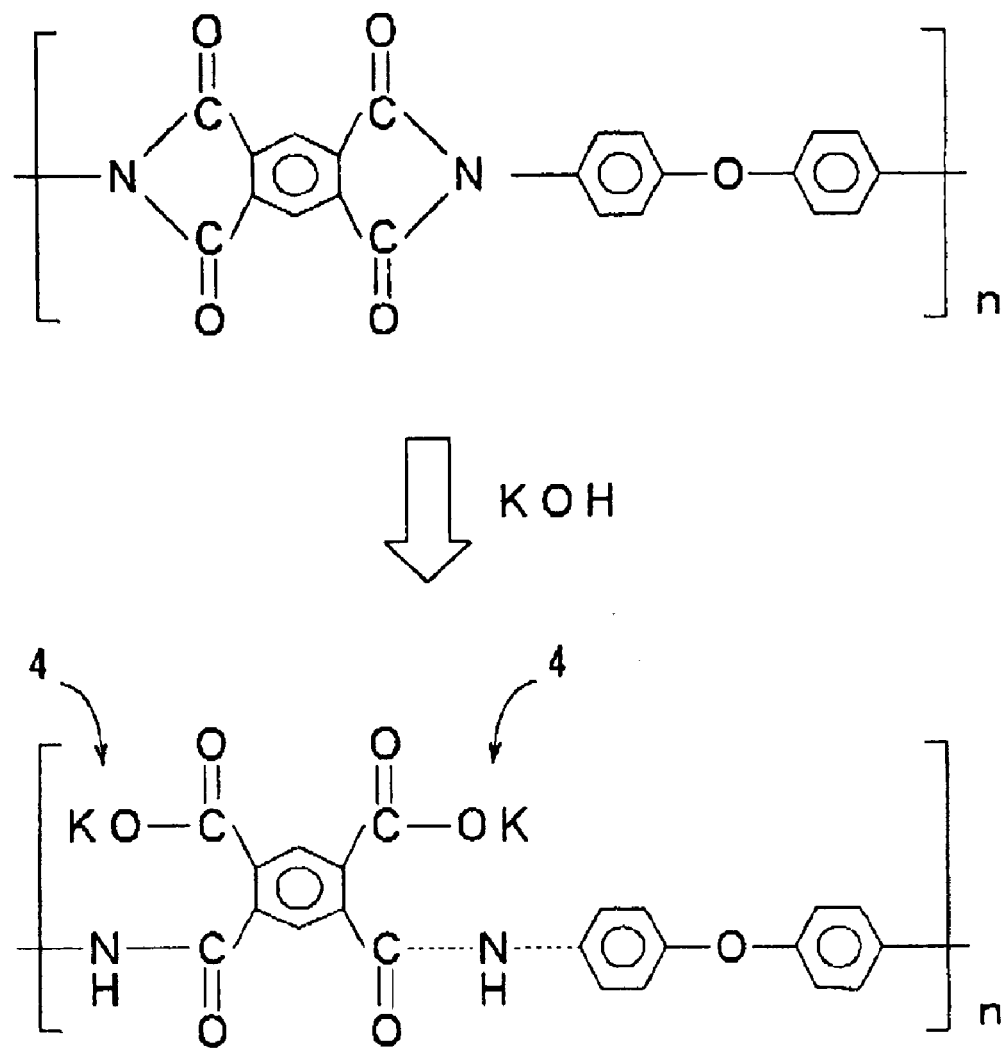
FIG. 2 is a diagram for explaining activation in the flexible printed board production method by way of structural formulae.
Figures 3A, 3B, 3C:
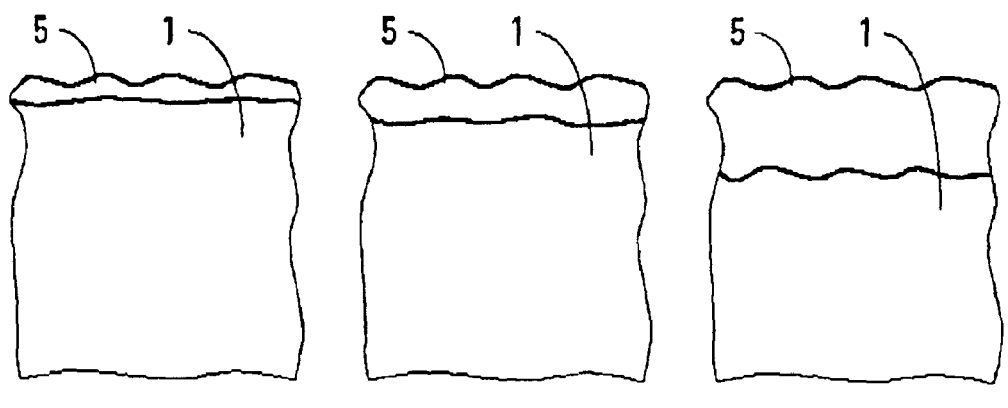
FIGS. 3(a) to 3(c) are schematic side views for explaining the activation.

As described above, the surface of the polyimide resin film imparted with the hydrophilic property by the plasma treatment is lightly activated with the use of the alkali metal hydroxide, whereby only the outermost surface portion of the polyimide resin film is roughened and imide rings are opened to provide functional groups 4 as shown in FIG. 2. FIG. 2 illustrates a case where potassium hydroxide is employed as the alkali metal hydroxide for the activation of a typical polyimide resin. In addition, the surface of the polyimide resin film is finely and uniformly roughened. The polyimide resin film 1 is moderately activated to a depth so as to provide an activated layer 5 preferably having a thickness of 30 to 150 nm as shown in FIG. 3(b). If the thickness of the activated layer 5 is smaller than 30 nm, the activation is insufficient as shown in FIG. 3(a). If the thickness of the activated layer 5 is greater than 150 nm, the polyimide resin film 1 is activated to an excessively great depth as shown in FIG. 3(c), so that the polyimide resin film 1 is likely to have deteriorated surface properties. With the activated layer 5 having a thickness outside the aforesaid range, the copper layer to be later formed tends to have insufficient adhesion after a heat load is applied to the copper layer.

The metal catalyst is not particularly limited, but examples thereof include palladium and platinum, which are typically employed in the art. The reducing agent is not particularly limited, but examples thereof include sodium hypophosphite, sodium boron hydride and dimethylamine borane. After the activation, the metal catalyst is applied to the surface of the polyimide resin film. At this time, the metal catalyst is bonded in the form of metal ions to the functional groups 4 generated by the opening of the imide rings (see FIG. 2). Then, the reduction treatment is performed on the polyimide resin film with the use of the reducing agent, whereby the metal ions are reduced into the metal.

The electroless nickel plating is carried out, for example, in an alkaline nickel bath. By the electroless nickel plating, nickel is deposited on the metal catalyst bonded to the functional groups 4 (see FIG. 2). The nickel layer formed by the electroless plating typically has a thickness of about 0.05 $\mu$m to about 0.3 $\mu$m. If the thickness of the nickel layer is smaller than 0.05 $\mu$m, the adhesion after the application of the heat load may drastically be reduced. If the thickness of the nickel layer is greater than 0.3 $\mu$m, formation of a minute circuit is difficult. For the formation of the nickel layer having a thickness in the aforesaid range, the electroless plating is carried out, for example, at 40° C. for 1 to 5 minutes.

The copper electroplating employs, for example, copper sulfate plating. By the copper electroplating, the copper layer is formed on the surface of the nickel layer. The thickness of the copper layer formed by the plating is not particularly limited, but typically in the range of about 5 $\mu$m to about 20 $\mu$m.

In the flexible printed board production method, the formation of the copper layer is achieved by the electroplating, so that the thickness of the copper layer can properly be controlled. Without the use of a deleterious substance, the production method is excellent in workability. Further, the production method does not require a high temperature heat treatment to be performed between the respective process steps and, hence, facilitates continuous production. As a result, the costs can be reduced.

Where the normal pressure plasma treatment is employed as the plasma treatment, the equipment costs are reduced and the continuous production is facilitated without the use of a vacuum vessel. As a result, the costs can further be reduced.

The activation with the use of the alkali metal hydroxide is lightly carried out and, hence, is less likely to affect the polyimide resin film which is less resistant to alkali.

By the light activation, only the outermost surface portion of the polyimide resin film is roughened, and the imide rings are opened to provide the functional groups. Therefore, the adhesion of the nickel layer to be later formed by the plating and, hence, the adhesion of the copper layer to be formed on the nickel layer by the plating are enhanced physically by the anchoring effect provided by the roughening and enhanced chemically by the bonds to the functional groups.

Since the activation is carried out after the plasma treatment of the surface of the polyimide resin film, the surface of the polyimide resin film is finely and uniformly roughened. Thus, a variation in the adhesion of the nickel layer and, hence, a variation in the adhesion of the copper layer can be reduced. As a result, a minute circuit can properly be formed.

Since the formation of the nickel layer precedes the formation of the copper layer, the adhesion of the copper layer before and after the application of the heat load can be enhanced. A reason why the adhesion is enhanced even after the application of the heat load is that the nickel layer suppresses diffusion of copper during the application of the heat load so as to suppress formation of a fragile copper oxide layer in the interface of the polyimide resin film.

Although nickel is employed for the electroless plating, a nickel alloy may be employed instead of nickel.

In a flexible printed board production method according to another embodiment of the present invention, a flexible printed board is produced in substantially the same manner as in the production method according to the aforesaid embodiment, except that a treatment with short wavelength ultraviolet radiation is employed instead of the plasma treatment.

More specifically, the short wavelength ultraviolet radiation may be emitted from a low pressure mercury lamp or a xenon excimer lamp. The short wavelength ultraviolet radiation emitted from the low pressure mercury lamp includes light having wavelengths of 184.9 nm and 253.7 nm, while the short wavelength ultraviolet radiation emitted from the xenon excimer lamp includes light having a wavelength of 172.0 nm. The short wavelength ultraviolet radiation including light having the aforesaid wavelengths has a higher energy level than ordinary ultraviolet radiation (having a wavelength of 365 nm) emitted from a high pressure mercury lamp. That is, the short wavelength ultraviolet radiation having a wavelength of 184.9 nm has an energy level of 647 kJ/mol, while the ordinary ultraviolet radiation having a wavelength of 365 nm has an energy level of 327.7 kJ/mol. Therefore, the application of the short wavelength ultraviolet radiation emitted from the low pressure mercury lamp decomposes oxygen to generate ozone and then active oxygen. The active oxygen acts on the surface of the polyimide resin film to generate hydrophilic functional groups such as hydroxyl groups, carboxyl groups and carbonyl groups on the outermost surface portion of the polyimide resin film. The application of the short wavelength ultraviolet radiation emitted from the xenon excimer lamp has substantially the same effects on the polyimide resin film.

This embodiment has substantially the same effects as the aforesaid embodiment. Particularly, the short wavelength ultraviolet radiation treatment features lower equipment costs, a higher and constant treatment rate and, hence, excellent continuous productivity and reduced costs, as compared with the plasma treatment, a corona treatment and an electron beam treatment.

Next, examples and comparative examples will be described.

EXAMPLE 1

A flexible printed board was produced in the following manner by forming a copper layer on a surface of a polyimide resin film by plating.

Plasma Treatment

First, a 20 cm×20 cm polyimide resin film (KAPTON 100EN available from Toray Du Pont Co., Ltd.) was set in a normal pressure plasma treatment device (AP-T01 available from Sekisui Chemical Co., Ltd.), and a surface of the polyimide resin film was plasma-treated. At this time, air was employed as the gas, and the flow rate thereof was 20 l/min. The output was 100 W, and the treatment period was 30 seconds.

Activation

The surface of the polyimide resin film was activated at 25° C. for two minutes with the use of a 50 g/l (1.25 mol/l) sodium hydroxide aqueous solution, whereby an activated layer 5 having a thickness of 52 nm was formed (see FIG. 3(b)).

Application of Catalyst and Reduction Treatment

A catalyst (OPC-50 INDUCER available from Okuno Chemical Industries Co., Ltd.) was applied onto the surface of the polyimide resin layer at 40° C. for five minutes, and then a reduction treatment was performed on the surface of the polyimide resin layer at 25° C. for five minutes with the use of a reducing agent (OPC-150 CRYSTER available from Okuno Chemical Industries Co., Ltd.)

Electroless Plating and Electroplating

The polyimide resin film was electrolessly plated in an alkali nickel bath (TMP CHEMICAL NICKEL available from Okuno Chemical Industries Co., Ltd.) at 40° C. for five minutes. Thus, a 0.2-μm thick nickel layer was formed. In turn, the resulting polyimide resin film was dried in a dry oven at 80° C. for ten minutes. Then, the polyimide resin film was electroplated at a current density of 2 A/dm² for 50 minutes with the use of a copper sulfate solution. Thus, a 20-μm thick copper layer was formed. A solution containing 70 g/l of copper sulfate, 200 g/l of sulfuric acid, 50 mg/l of chlorine ions and 5 g/l of a brightener (TOP LUCINA SF available from Okuno Chemical Industries Co., Ltd.) was employed as the copper sulfate solution.

EXAMPLE 2

A flexible printed board was produced in substantially the same manner as in Example 1, except that argon was employed as the gas for the plasma treatment.

EXAMPLE 3

A flexible printed board was produced in substantially the same manner as in Example 1, except that nitrogen was employed as the gas for the plasma treatment.

EXAMPLE 4

A flexible printed board was produced in substantially the same manner as in Example 1, except that a short wavelength ultraviolet radiation treatment was performed instead of the plasma treatment and the activated layer 5 formed by the activation had a thickness of 60 nm.

Short Wavelength Ultraviolet Radiation Treatment

First, a 20 cm×20 cm polyimide resin film (KAPTON 100EN available from Toray Du Pont Co., Ltd.) was set in an ultraviolet radiation surface modification device (available from Sen Engineering Co., Ltd.), and a surface of the polyimide resin film was treated with short wavelength ultraviolet radiation. At this time, the illuminance of the short wavelength ultraviolet radiation was 15 mW/cm², the output was 200 W, and the treatment period was 30 seconds.

COMPARATIVE EXAMPLE 1

A flexible printed board was produced in substantially the same manner as in Example 1, except that the plasma treatment was not performed.

COMPARATIVE EXAMPLE 2

A flexible printed board was produced in substantially the same manner as in Example 4, except that the short wavelength ultraviolet radiation treatment was not performed and the activation was carried out at 40° C. for ten minutes.

The adhesion of the copper layer of each of the flexible printed boards of Examples 1 to 4 and Comparative Examples 1 and 2 thus produced was measured. By means of a tensile tester (available from Orientech Co., Ltd.), the measurement was carried out before and after a heat load was applied at 150° C. for three days to determine initial adhesion and post-load adhesion. In the measurement, a 1-cm wide strip cut out of the flexible printed board was subjected to a 180-degree pealing strength test. Further, a minute circuit was formed on each of the flexible printed boards. The results are shown in Table 1, in which a flexible printed board having an excellent minute circuit formability is indicated by o and a flexible printed board having a poor minute circuit formability is indicated by x.

TABLE 1

| | Surface treatment | Adhesion (N/cm) | | Minute circuit formability |
|---|---|---|---|---|
| | | Initial | Post-load (150° C. × 3 days) | |
| Example 1 | Plasma (air) | 12.5 | 5.4 | ○ |
| Example 2 | Plasma (Ar) | 10.2 | 3.0 | ○ |
| Example 3 | Plasma ($N_2$) | 13.0 | 6.4 | ○ |
| Example 4 | SWUV* | 12.0 | 6.8 | ○ |
| Comparative Example 1 | — | 7.5 | 1.4 | X |
| Comparative Example 2 | — | 8.7 | 1.2 | X |

*SWUV: Short wavelength ultraviolet radiation

As apparent from the results shown in Table 1, the copper layers of the flexible printed boards of Examples 1 to 4 each had high adhesion before and after the application of the heat load, as compared with the flexible printed boards of Comparative Examples 1 and 2. Further, the flexible printed boards of Examples 1 to 4 were excellent in minute circuit formability.

Further, flexible printed boards with activated layers having different thicknesses were produced for measurement of the adhesion of copper layers thereof. More specifically, flexible printed boards (Examples 5 and 7) with activated layers 5 each having a thickness smaller than in Examples 3 and 4, and flexible printed boards (Examples 6 and 8) with activated layers 5 each having a thickness greater than in Examples 3 and 4 were produced.

EXAMPLE 5

A flexible printed board was produced in substantially the same manner as in Example 3, except that the activation was carried out for 0.3 minutes and the activated layer 5 had a thickness of 13 nm (see FIG. 3(a)).

EXAMPLE 6

A flexible printed board was produced in substantially the same manner as in Example 3, except that the activation was carried out for 3 minutes and the activated layer 5 had a thickness of 160 nm (see FIG. 3(c)).

EXAMPLE 7

A flexible printed board was produced in substantially the same manner as in Example 4, except that the activation was carried out for 0.3 minutes and the activated layer 5 had a thickness of 15 nm (see FIG. 3(a))

EXAMPLE 8

A flexible printed board was produced in substantially the same manner as in Example 4, except that the activation was carried out for 3 minutes and the activated layer 5 had a thickness of 165 nm (see FIG. 3(c)).

The adhesion of the copper layer of each of the flexible printed boards of Examples 3, 4 and 5 to 8 thus produced was measured. By means of a tensile tester (available from Orientech Co., Ltd.), the measurement was carried out before and after a heat load was applied at 150° C. for three days to determine initial adhesion and post-load adhesion. In the measurement, a 1-cm wide strip cut out of the flexible printed board was subjected to a 180-degree pealing strength test. The results are shown in Tables 2 and 3.

TABLE 2

(Plasma treatment)

| | Thickness (nm) of activated layer | Adhesion (N/cm) | |
|---|---|---|---|
| | | Initial | Post-load (150° C. × 3 days) |
| Example 5 | 13 | 8.0 | 1.4 |
| Example 3 | 52 | 13.0 | 6.4 |
| Example 6 | 160 | 13.5 | 4.0 |

TABLE 3

(Short wavelength ultraviolet radiation treatment)

| | Thickness (nm) of activated layer | Adhesion (N/cm) | |
|---|---|---|---|
| | | Initial | Post-load (150° C. × 3 days) |
| Example 7 | 15 | 7.5 | 1.2 |
| Example 4 | 60 | 12.0 | 6.8 |
| Example 8 | 165 | 13.0 | 4.5 |

As apparent from the results shown in Tables 2 and 3, the copper layers of the flexible printed boards of Example 3 (52 nm) and Example 4 (60 nm) each had sufficient adhesion before and after the application of the heat load. However, the copper layers of the flexible printed boards of Example 5 (13 nm) and Example 7 (15 nm) each had poorer adhesion than those of Examples 3 and 4 before and after the application of the heat load, and the copper layers of the flexible printed boards of Example 6 (160 nm) and Example 8 (165 nm) each had poorer adhesion than those of Examples 3 and 4 after the application of the heat load. This indicates that the thickness of the activated layer 5 is preferably in the range of 30 to 150 nm.

In the flexible printed board production method according to the present invention, as described above, the surface of the polyimide resin film is treated with plasma or short wavelength ultraviolet radiation, and then activated with the use of the alkali metal hydroxide. Thus, the activation is carried out after the surface of the polyimide resin film is imparted with a hydrophilic property by the plasma treatment or the short wavelength ultraviolet radiation treatment. Therefore, the activation may lightly be carried out and, hence, is less likely to affect the polyimide resin film which is less resistant to alkali. Further, only the outermost surface portion of the polyimide resin film is roughened and imide rings are opened to provide functional groups by the light activation. Therefore, the adhesion of the nickel layer or the like to be formed by the electroless plating and, hence, the adhesion of the copper layer to be formed on the nickel layer or the like by the plating can be enhanced physically by the anchoring effect provided by the roughening and enhanced chemically by the bonds to the functional groups. The surface of the polyimide resin film can finely and uniformly be roughened by the activation after the plasma treatment or the short wavelength ultraviolet radiation treatment. Therefore, a variation in the adhesion of the nickel layer and, hence, a variation in the adhesion of the copper layer can be reduced. As a result, a minute circuit can properly be formed. The flexible printed board production method is excellent in workability without the use of a deleterious substance. Further, the production method does not require a high temperature heat treatment to be performed between the respective process steps and, hence, facilitates continuous production. As a result, the costs can be reduced.

Where the normal pressure plasma treatment is employed as the plasma treatment in the flexible printed board production method according to the present invention, the use of no vacuum vessel reduces the equipment costs and facilitates the continuous production. As a result, the costs can be reduced.

Where the activation is carried out at 25° C. for 0.5 to 2 minutes with the use of 0.5 to 2 mol/l of the alkali metal hydroxide in the flexible printed board production method according to the present invention, the activated layer having a proper thickness in the range of 30 to 150 nm can be formed. Even after the application of the heat load, the copper layer has sufficiently great adhesion.

Where the activated layer has a thickness of 30 to 150 nm in the flexible printed board production method according to the present invention, the copper layer has sufficiently great adhesion even after the application of the heat load.

What is claimed is:

1. A production method for a flexible printed board, comprising the steps of:
   treating a surface of a polyimide resin film with plasma or short wavelength ultraviolet radiation to be imparted with a hydrophilic property;
   activating the treated surface with the use of an alkali metal hydroxide;
   electrolessly plating the activated surface of the polyimide resin film with nickel or a nickel alloy; and
   electroplating the electrolessly plated surface of the polyimide resin film with copper, whereby a copper layer is formed on the surface of the polyimide resin film.

2. A flexible printed board production method as set forth in claim 1, wherein a normal pressure plasma treatment is employed as the plasma treatment.

3. A flexible printed board production method as set forth in claim 2, wherein the activation is carried out at 25° C. for 0.5 to 2 minutes with the use of 0.5 to 2 mol/l of the alkali metal hydroxide.

4. A flexible printed board production method as set forth in claim 3, further comprising the steps of: applying a metal catalyst onto the surface of the polyimide resin film; and performing a reduction treatment with the use of a reducing agent; the catalyst application step and the reduction step following the activation step and preceding the electroless plating step.

5. A flexible printed board production method as set forth in claim 2, wherein an activated layer formed in the surface of the polyimide resin film in the activation step has a thickness of 30 to 150 nm.

6. A flexible printed board production method as set forth in claim 5, further comprising the steps of: applying a metal catalyst onto the surface of the polyimide resin film; and performing a reduction treatment with the use of a reducing agent; the catalyst application step and the reduction step following the activation step and preceding the electroless plating step.

7. A flexible printed board production method as set forth in claim 2, further comprising the steps of: applying a metal catalyst onto the surface of the polyimide resin film; and performing a reduction treatment with the use of a reducing agent; the catalyst application step and the reduction step following the activation step and preceding the electroless plating step.

8. A flexible printed board production method as set forth in claim 1, wherein a low pressure mercury lamp or a xenon excimer lamp is employed for the short wavelength ultraviolet radiation treatment.

9. A flexible printed board production method as set forth in claim 3, wherein the activation is carried out at 25° C. for 0.5 to 2 minutes with the use of 0.5 to 2 mol/l of the alkali metal hydroxide.

10. A flexible printed board production method as set forth in claim 9, further comprising the steps of: applying a metal catalyst onto the surface of the polyimide resin film; and performing a reduction treatment with the use of a reducing agent; the catalyst application step and the reduction step following the activation step and preceding the electroless plating step.

11. A flexible printed board production method as set forth in claim 8, wherein an activated layer formed in the surface of the polyimide resin film in the activation step has a thickness of 30 to 150 nm.

12. A flexible printed board production method as set forth in claim 11, further comprising the steps of: applying a metal catalyst onto the surface of the polyimide resin film; and performing a reduction treatment with the use of a reducing agent; the catalyst application step and the reduction step following the activation step and preceding the electroless plating step.

13. A flexible printed board production method as set forth in claim 8, further comprising the steps of: applying a metal catalyst onto the surface of the polyimide resin film; and performing a reduction treatment with the use of a reducing agent; the catalyst application step and the reduction step following the activation step and preceding the electroless plating step.

14. A flexible printed board production method as set forth in claim 1, wherein the activation is carried out at 25° C. for 0.5 to 2 minutes with the use of 0.5 to 2 mol/l of the alkali metal hydroxide.

15. A flexible printed board production method as set forth in claim 14, further comprising the steps of: applying a metal catalyst onto the surface of the polyimide resin film; and performing a reduction treatment with the use of a reducing agent; the catalyst application step and the reduction step following the activation step and preceding the electroless plating.

16. A flexible printed board production method as set forth in claim 1, wherein an activated layer formed in the surface of the polyimide resin film in the activation step has a thickness of 30 to 150 nm.

17. A flexible printed board production method as set forth in claim 16, further comprising the steps of: applying a metal catalyst onto the surface of the polyimide resin film; and performing a reduction treatment with the use of a reducing agent; the catalyst application step and the reduction step following the activation step and preceding the electroless plating step.

18. A flexible printed board production method as set forth in claim 1, further comprising the steps of: applying a metal catalyst onto the surface of the polyimide resin film; and performing a reduction treatment with the use of a reducing agent; the catalyst application step and the reduction step following the activation step and preceding the electroless plating step.

* * * * *